(12) United States Patent
Devlin et al.

(10) Patent No.: US 7,949,059 B2
(45) Date of Patent: May 24, 2011

(54) PEAK-TO-AVERAGE-POWER REDUCTION OF OFDM SIGNALS

(75) Inventors: Carole Devlin, Blackrock (IE); Anding Zhu, Shankill (IE); Thomas Brazil, Blackrock (IE)

(73) Assignee: University College Dublin, National University of Ireland, Dublin, Dublin (IE)

( * ) Notice: Subject to any disclaimer, the term of this patent is extended or adjusted under 35 U.S.C. 154(b) by 801 days.

(21) Appl. No.: 11/979,678

(22) Filed: Nov. 7, 2007

(65) Prior Publication Data

US 2008/0112496 A1 May 15, 2008

(30) Foreign Application Priority Data

Nov. 9, 2006 (IE) .................................. S2006/0814

(51) Int. Cl.
*H04L 27/28* (2006.01)
(52) U.S. Cl. ........................................ 375/260; 375/267
(58) Field of Classification Search .................. 375/260, 375/267
See application file for complete search history.

(56) References Cited

U.S. PATENT DOCUMENTS

| | | | | |
|---|---|---|---|---|
| 7,542,517 B2* | 6/2009 | Kroeger | ......................... | 375/296 |
| 7,822,130 B2* | 10/2010 | Walvis et al. | ................. | 375/260 |
| 2004/0141548 A1* | 7/2004 | Shattil | ........................... | 375/146 |
| 2007/0098090 A1* | 5/2007 | Ma et al. | ........................ | 375/260 |

OTHER PUBLICATIONS

Anirudha et al. IEEE, A Simple Algorithm for the Reduction of the Peak Power in a Many Carrier AM-OFDM Signal, pp. 1709-1713.*
Ouderaa et al., Peak Factor Minimization of Input and Output Signals of Linear Systems, 37 IEEE Transactions on Instrumentation and Measurement 2, 207-212 (1988).
Walambe et al., A Simple Algorithm for the Reduction of the Peak Power in a Many Carrier AM-OFDM Signal, WINLAB—Rutgers University, 1709-1713 (2001).

* cited by examiner

*Primary Examiner* — Chieh M. Fan
*Assistant Examiner* — Freshteh N Aghdam
(74) *Attorney, Agent, or Firm* — The Nath Law Group; Jerald L. Meyer; Robert T. Burns (57) ABSTRACT

A method of processing an Orthogonal Frequency-Division Multiplex (OFDM) signal having a plurality of data carriers and a plurality of unused carriers is disclosed. The method comprises transforming an original frequency-domain OFDM signal into a time domain signal and simulating the effect of a non-linear amplifier on the time-domain signal to provide a potentially distorted time domain signal. The potentially distorted time domain signal is transformed into a potentially distorted frequency domain signal and at least some of any values of the data carriers in the potentially distorted frequency domain signal are restored with corresponding values from the original frequency domain signal. At least some of the unused carriers in the at least partially restored frequency domain signal are scaled with a scaling factor. The scaled frequency domain signal is transformed into a temporary time domain signal and the temporary time domain signal is analysed for the presence of a peak or near zero amplitude value that would lead to distortion by said amplifier. If the signal includes such a peak or near zero value, the scaling, transforming and analysing are repeated with an increased scaling factor.

11 Claims, 7 Drawing Sheets

PEAK-TO-AVERAGE-POWER REDUCTION OF OFDM SIGNALS

FIELD OF THE INVENTION

The present invention relates a method of processing an Orthogonal Frequency-Division Multiplexing signal. More particularly, the invention relates to a method of reducing distortion of an Orthogonal Frequency-Division Multiplexing signal.

BACKGROUND OF THE INVENTION

Orthogonal Frequency-Division Multiplexing (OFDM) is a popular modulation technique which has many well documented advantages such as high spectral efficiency, immunity to frequency selective fading and high data rate transmission, see Cimini, L., Jr., "Analysis and Simulation of a Digital Mobile Channel Using Orthogonal Frequency Division Multiplexing," IEEE Transactions on Communications, vol. 33, no. 7 pp. 665-675, July 1985.

Figure 1:
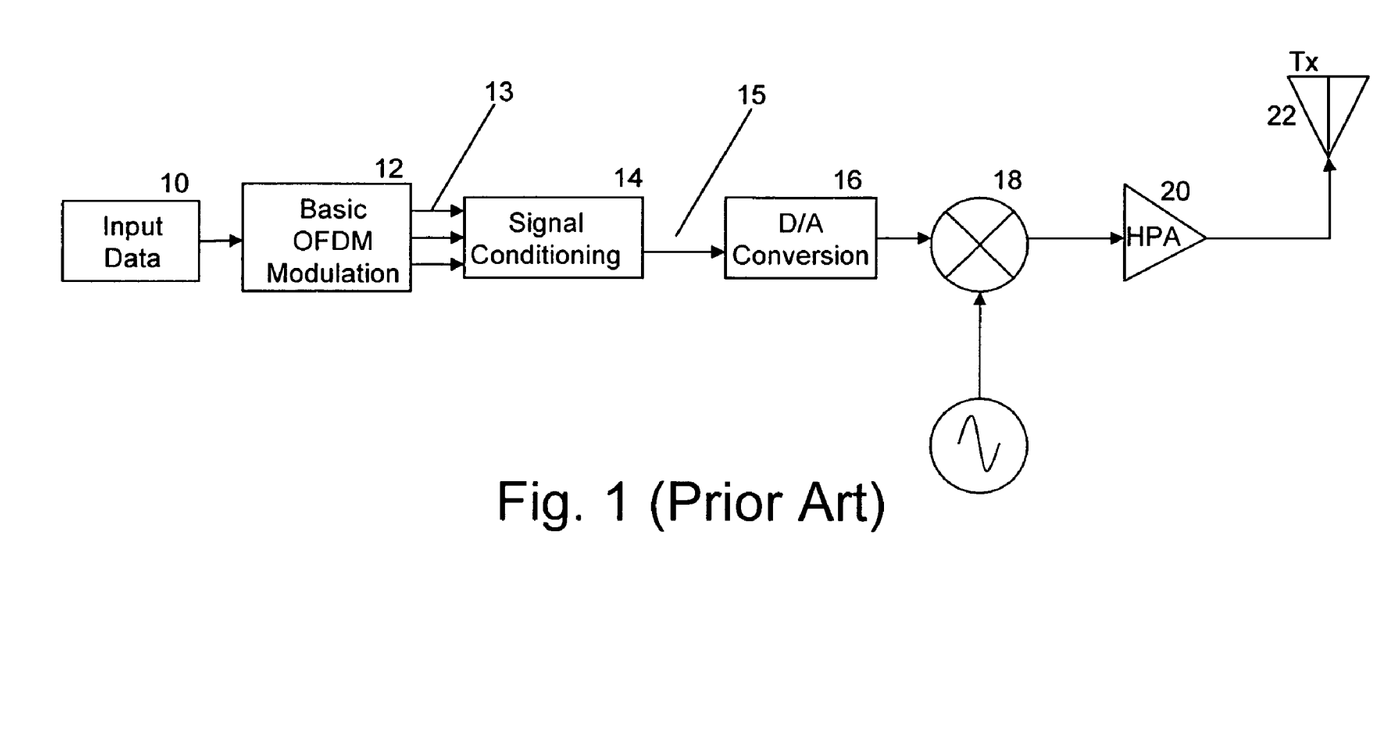
FIG. 1 shows schematically the main components of a typical ODFM transmitter.

Referring now to FIG. 1, there is shown schematically the main components of an ODFM transmitter. Input data 10 comprising voice related or data traffic is fed to an OFDM modulator 12 which distributes the data across a number of carriers 13 and for each carrier, sets an amplitude and phase value derived from the input data. A plurality of pilot signals are included among the data carriers 13, and some schemes also specify a number of unused carriers. The OFDM carrier data 13 can be conditioned 14 as described below before being converted to a time domain signal 15. This is in turn converted 16 to an analog signal before being upconverted 18 and then amplified 20 before being transmitted 22.

In OFDM systems, transmitted signal includes a sum of orthogonal sub-carriers that are modulated by complex data symbols. For an OFDM system with N sub-carriers, the transmitted baseband signal x(t) can be written as:

$$x(t) = \frac{1}{\sqrt{N}} \sum_{k=0}^{N-1} X_k e^{j(2\pi k \Delta f t)}, \quad 0 \le t \le T \quad (1)$$

where $X_k$ is the symbol carried by the kth sub-carrier, f is the frequency difference between sub-carriers, and T is the OFDM symbol duration. To ensure orthogonality among sub-carriers, the OFDM symbol duration should be T=1/Δf, the inverse of the frequency spacing of the sub-carriers. In the transmitter, the transmitted signal or sequence may be generated by the inverse fast Fourier transform (IFFT) of the N-point $\{X_k\}$ sequence $$x_n = \text{IFFT}(X_k) \quad (2)$$

where the N-point sequence $\{X_k\}$ is the sampled version of the transmitted signal x(t).

For example, an OFDM signal generated in IEEE 802.11a/HiperLAN2 Wireless LAN system comprises 64 sub-carriers, 48 of these are data carriers. Pilot sub-carriers are embedded in the OFDM signal among the data sub-carriers in order to enable channel estimation and frequency-offset tracking. There are 4 pilot sub-carriers for an IEEE 802.11a/HiperLAN2 Wireless LAN system. The remaining carriers are not used and have a value of zero.

A major disadvantage within OFDM systems is the rare occurrence of high peaks in the transmission signal. Such peaks in an OFDM signal can cause severe in-band and out-of-band distortion of a signal when entering the saturation region of the power amplifier 20. One way of quantifying the presence of the high peaks in a signal, is through measurement of the Peak-to-Average-Power Ratio (PAPR).

The PAPR of the transmitted signal can be expressed as:

$$PAPR = 10 \log_{10} \left( \frac{\max|x(t)|^2}{E[|x(t)|^2]} \right) \quad (3)$$

where E[] denotes the expectation. From equation (3), it will be seen that PAPR increases proportionally with the number of sub-carriers.

The simplest technique to combat this problem is to back off the operating point of the power amplifier 20 to accommodate extreme peaks. This can cause significant reduction in the transmission power impacting the efficiency of the amplifier—typical power efficiency of a class AB High Power Amplifier (HPA) is around 18% for an IEEE802.11a system, see Chen, K. C.; Morris, K. A.; Beach, M. A., "Increasing the power efficiency of an IEEE802.11a power amplifier," IEEE 61st Vehicular Technology Conference, vol. 2, pp. 954-957, 30 May-1 Jun. 2005.

It is therefore preferable to reduce the Peak-To-Average-Power Ratio (PAPR) of the signal, without the need to back off the amplifier operating power.

For certain architectures including polar amplifier architecture it is also desirable to remove near-zero values of the amplitude signal. Polar architecture was designed by Kahn, L. R., "Single sideband transmission by envelope elimination and restoration," Proc. IRE, vol. 40, pp 803-806, July 1952 for high amplifier efficiency. In polar systems the input signal is split into its amplitude and phase components. The phase modulation is generated digitally, up-converted and amplified with a nonlinear, highly efficient power amplifier. The amplitude modulation is added by modulating the supply voltage of the PA, thus yielding improved power efficiency.

If a near zero-amplitude value occurs in the OFDM signal, additional distortion will occur at the output of the polar amplifier or it may be forced to shut off, if the supply voltage becomes too low.

Various approaches to conditioning the signal prior to arriving at the amplifier have been proposed.

On the one hand, numerous techniques have been developed for reducing the PAPR of the OFDM signal.

For example, clipping is used as a PAPR reduction technique, but this can cause in-band and out-of-band distortion. Filtering can then be used to alleviate out-of-band distortion but results in peak re-growth. As such, repeated clipping and filtering can lead to serious degradation in Bit Error Rate (BER), see Armstrong, J., "Peak-to-average power reduction for OFDM by repeated clipping and frequency domain filtering," Electronics Letters, vol. 38, no. 5 pp. 246-247.

Another approach, windowing, involves multiplying large signal peaks by a non-rectangular window, such as a Gaussian pulse, to minimize the out-of-band interference. Ideally the window should be as narrow band as possible but it should not be too long in the time domain as this means more signal samples are effected, which causes an increase in the BER, see van Nee, R.; de Wild, A., "Reducing the peak-to-average power ratio of OFDM". 48th IEEE Vehicular Technology Conference, 1998, vol. 3, pp. 2072-2076, 18-21 May 1998.

Windowing has higher BER compared with clipping but produces lower out-of-band distortion.

Selective Mapping (SLM) is another approach. SLM is implemented by generating a set of sufficiently different candidate signals from the original data signal. The transmitter selects and submits the candidate signal having the lowest PAPR.

Partial Transmit Sequencing (PTS) is a similar technique in which sub-blocks of the original signal are optimally combined at the transmitter for generating a transmitter with a low PAPR. Although SLM and PTS are effective at reducing the PAPR, they require the use of side information to the receiver in order to decode the signal at the receiver, see Seung Hee Han; Jae Hong Lee, "An overview of peak-to-average power ratio reduction techniques for multicarrier transmission," IEEE Wireless Communications, vol. 12, no. 2 pp. 56-65, April 2005.

Pilot tones having the same amplitude are optimal for channel estimation. Hosokawa, S.; Ohno, S.; Teo, K. A. D.; Hinamoto, T., "Pilot tone design for peak-to-average power ratio reduction in OFDM," ISCAS 2005. IEEE International Symposium on Circuits and Systems, 2005, vol. 6, pp. 6014-6017, 23-26 May 2005 discloses allowing the phase of pilot tones in a OFDM signal to be varied for reducing PAPR. However, the phase values to be used are calculated using an exhaustive search which can involve delay and/or significant processor resources to calculate.

There are also available unused sub-carriers, which normally have a value of zero in order to ensure the spectrum lies within the defined mask. However, Wang et al.—Chin-Liang Wang; Yuan Ouyang; Hsien-Chih Chen, "A peak-to-average power ratio reduction technique for the IEEE 802.11a wireless LAN," IEEE 58th Vehicular Technology Conference, 2003, vol. 4, pp. 2287-2291, 6-9 Oct. 2003—show that 5 unused sub-carriers in an IEEE 802.11/HiperLAN2 Wireless LAN System can be used for PAPR reduction while keeping the out-of-band distortion well within the spectral mask. This has the effect a slight broadening of the original OFDM symbol and again Wang is based on possibly exhaustive evaluation of combinations of unused carried amplitude and phase values in order to determine an optimal combination for PAPR reduction.

Figure 6:
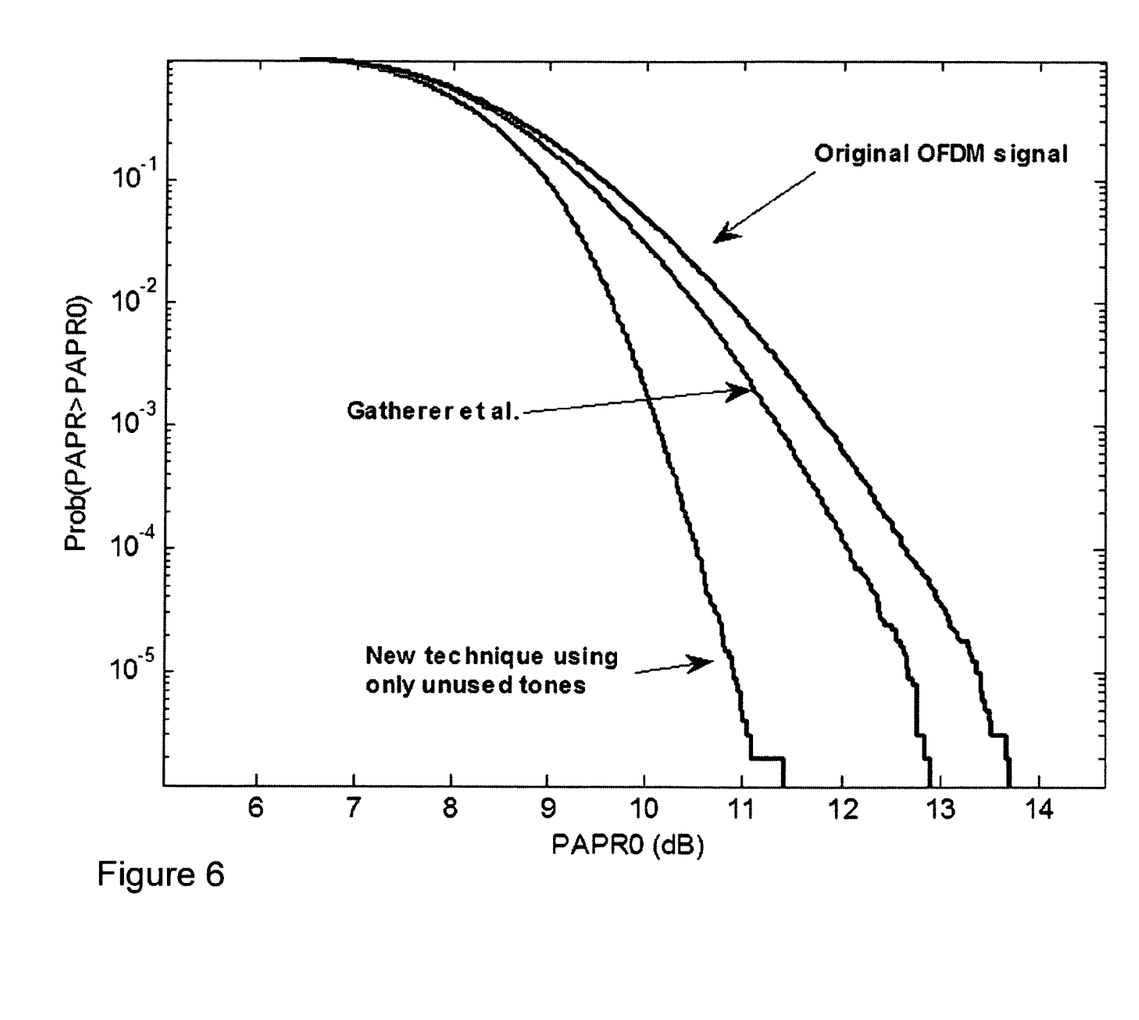
FIG. 6 shows the comparative effectiveness of an embodiment of the present invention with that of Gatherer et al.

Gatherer, A.; Polley, M. Signals, "Controlling clipping probability in DMT transmission" *Conference Record of the Thirty-First Asilomar Conference on Systems & Computers*, Vol. 1, Iss., pp. 578-584, November 1997, also propose a PAPR reduction technique employing use of the unused tones. However this is based on continually clipping the signal until a desired threshold is reached. Convergence is very slow and PAPR can often increase following iteration. A comparison between the authors' technique and this is illustrated in FIG. 6.

Several techniques have also been proposed for the removal of near-zero values in the time domain.

Rudolph, D. "Kahn EER technique with single-carrier digital modulations" *IEEE Transactions on Microwave Theory and Techniques*, Vol. 51, Iss. 2, February 2003 Pages: 548-552 describes a method of cancelling near-zero amplitude values of OFDM signals by adding cancellation signals to the near zero-values in the time domain. However this results in a considerable amount of extra power in the signal and a high BER. Computationally complex 'hole blowing' techniques also exist to remove these zero crossings too.

Rudolph and Schaefer, "Method for reducing the out-of-band emission in AM transmitters for digital transmission", U.S. patent application Ser. No. 10/275,424 also propose a technique which modifies the signal in the frequency domain prior to the operation of the IFFT. In the frequency domain the signal is composed of I and Q components, real and imaginary components. When both the I and Q components simultaneously have zero values a zero or near-zero amplitude results after an IFFT is performed and the signal is converted into the time domain. By adding a pulse to one of the I or Q components in the frequency domain, the near-zero value can be eliminated in the time domain. This helps reduce out-of-band distortion at the output of the polar transmitter.

Robinson and Winter "Modified polar amplifier architecture" U.S. patent Ser. No. 10/719,514, propose an amplifier system that switches between operation in a polar mode. In one aspect of their invention, an amplifier system is provided that includes a power amplifier and a mode selector. The power amplifier is operative to amplify an input signal to provide an amplified output signal. The mode selector controls the operation of the amplifier system in the polar mode based on a characteristic of the input signal relative to a threshold level.

It is an object of this invention to provide a method for PAPR reduction technique as well as removing unwanted near zero values, but which causes no decrease in data throughput, results in very low out-of-band distortion, requires no side information to be transmitted and has a lower BER compared with clipping and windowing.

SUMMARY OF THE INVENTION

According to a first aspect of the present invention, there is provided a method of processing an Orthogonal Frequency-Division Multiplex (OFDM) signal having a plurality of data carriers and a plurality of unused carriers, the method comprising:
  (a) transforming an original frequency-domain OFDM signal into a time domain signal;
  (b) simulating the effect of a non-linear amplifier on the time-domain signal to provide a potentially distorted time domain signal;
  (c) transforming the potentially distorted time domain signal into a potentially distorted frequency domain signal;
  (d) restoring at least some of any values of the data carriers in the potentially distorted frequency domain signal with corresponding values from said original frequency domain signal;
  (e) scaling at least some of the unused carriers in the at least partially restored frequency domain signal with a scaling factor;
  (f) transforming the scaled frequency domain signal into a temporary time domain signal;
  (g) analysing the temporary time domain signal for the presence of a peak or near-zero amplitude value that would lead to distortion by said amplifier; and
  (h) responsive to said signal including such a peak or near zero value, repeating steps (e), (f) and (g) with an increased scaling factor.

Preferably, said scaling factor is initially set to 1. Preferably, said scaling factor is incremented in steps which are sized to balance speed of convergence and effective PAPR reduction.

Preferably, the method further comprises the step of:
  (i) responsive to said signal not including such a peak or near zero amplitude value, modulating, amplifying and transmitting said temporary time domain signal.

The present invention allows the clipping effect of an amplifier to be simulated before transmission of a signal, so that the signal can be adjusted until the potential effect of clipping is minimised. Distortion of a small number of the unused carriers is maintained as it is assumed that this absorbs the distortion of the data carriers that would otherwise result in bit errors at the receiver.

Preferably, said simulating is performed according to the equations:

$$y = \begin{cases} |x|e^{j\phi}, & |x| \le A \, \& |x| > B \\ Ae^{j\phi} & |x| > A \\ Be^{j\phi} & |x| < B \end{cases} \quad (5)$$

where x is the time domain signal, y represents the output of the time domain signal after clipping, A is an upper threshold clipping level, B is a lower clipping threshold and φ is the signal phase.

Preferably, the time domain signal is oversampled before said simulating.

Preferably, the time domain signal is oversampled by a factor of four.

Preferably, the original frequency domain signal further comprises a plurality of pilot carriers, and wherein said restoring comprises:

restoring the amplitude of the pilot carriers to their original amplitude.

The altered phase values of the pilot carriers introduced by the amplifier provide a further outlet for absorption of the signal distortion. As the amplitudes are maintained at the same magnitude, the phases can be exploited for reducing the PAPR.

Preferably, the method further comprises the step of:
responsive to the respective ratios of a highest peak and a lowest amplitude in a temporary time domain signal to the average power of the temporary time domain signal not being less or greater than said ratio for a previous temporary time domain signal, modulating, amplifying and transmitting said temporary time domain signal.

Preferably, said steps (e), (f) and (g) are not repeated more than a maximum number of iterations.

In a second aspect, the invention provides a method of processing an Orthogonal Frequency-Division Multiplex (OFDM) signal having a plurality of carriers, at least some of which include one or more pilot symbols, the method comprising:

(a) transforming an original frequency-domain OFDM signal into a time domain signal;
(b) simulating the effect of a non-linear amplifier on the time-domain signal to provide a potentially distorted time domain signal;
(c) transforming the potentially distorted time domain signal into a potentially distorted frequency domain signal;
(d) restoring at least some of any amplitude values of any pilot symbol samples in the potentially distorted frequency domain signal with corresponding values from said original frequency domain signal;
(e) transforming the potentially restored frequency domain signal into a temporary time domain signal;
(f) analysing the temporary time domain signal for the presence of a peak or near zero amplitude value that would lead to distortion by said amplifier; and
(g) responsive to said signal not including such a peak or near zero value, modulating, amplifying and transmitting said temporary time domain signal.

Preferably, said carriers include one or more carriers dedicated to pilot symbols.

The second aspect of the invention allows for an improvement in the Peak-to-Average-Power ratio of the OFDM signal as well as the removal of near zero values, without substantial modification of the OFDM signal. As the important factor with the pilot tones is that their amplitude is maintained, whereas the phase of the pilot tones can be adjusted without greatly affecting channel estimation or frequency tracking in a receiver.

BRIEF DESCRIPTION OF THE DRAWINGS

An embodiment of the invention will now be described, by way of example, with reference to the accompanying drawings, in which.

DESCRIPTION OF THE PREFERRED EMBODIMENT

The preferred embodiment is implemented as an improved signal conditioning stage 14 for a transmitter of the type shown in FIG. 1.

Figure 2:
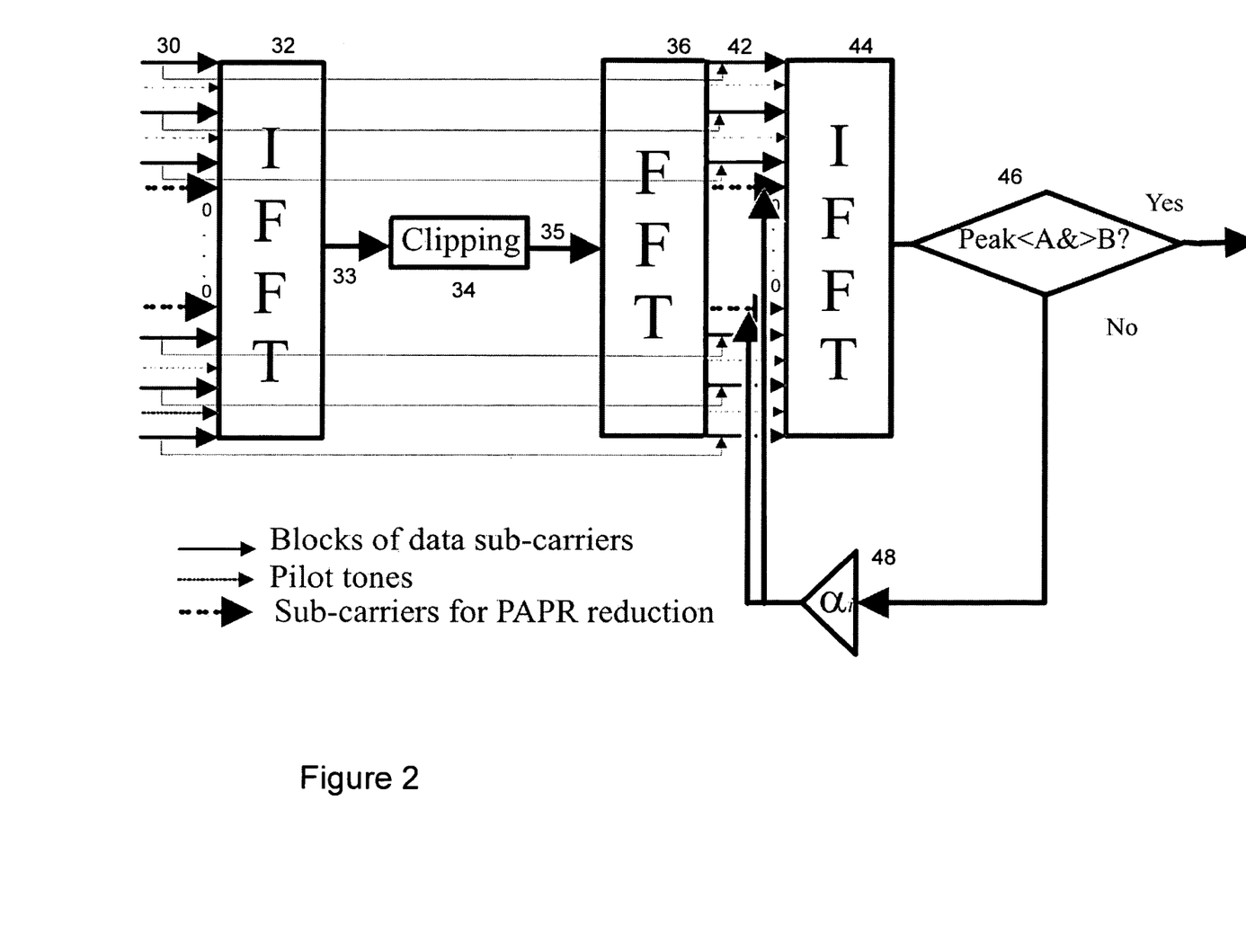
FIG. 2 is a block diagram illustrating conditioning of OFDM carriers according to a preferred embodiment of the present invention.

Referring now to FIG. 2, there is shown schematically the processing performed within the conditioning stage of the preferred embodiment. Firstly, an original frequency domain OFDM signal 30, including data sub-carriers, pilot signals and unused carriers, is transformed into the time domain, via an Inverse Fast Fourier Transform (IFFT) 32. Then, the distortion and clipping that is normally experienced when the original signal is transmitted through an amplifier is simulated.

Before simulation, the time domain signal is oversampled 33, and then the high peak signal values and near zero amplitude values that are present in the time domain signal are clipped 34.

Oversampling by a factor of 4 is preferable for accurate peak detection and prevention of peak re-growth at the receiver. For an oversampling factor of I, the input signal to the Inverse Fast Fourier Transform (IFFT) is extended by including N(I-1) zeros in the centre of the signal.

In the preferred embodiment, Saleh's memoryless model—see A. Saleh and J. Salz, "Adaptive Linearization of Power Amplification in Digital Radio Systems," Bell System Technical Journal, vol. 62, no. 4, April 1983 is used to simulate the power amplifier 20. Here, if the complex envelope of the input signal to the HPA is represented by:

$$x(t)=|x(t)|e^{[j\phi t]} \quad (4)$$

The output signal of the HPA can be represented by:

$$z(t) = A[|x(t)|]e^{j(\phi(t)+\beta[|x(t)|])} \quad (5)$$

where $A(\rho)$ and $\beta(x(t))$ represent AM-AM and AM-PM distortion of the nonlinear amplifier respectively. AM-AM distortion stands for the amplitude-to-amplitude modulation distortion, and is described as the non-linear transfer function between a control voltage input in volts versus the output RF voltage. AM-PM distortion stands for the amplitude-to-phase modulation distortion. This distortion can be modeled as follows:

$$A[|x(t)|] = A_{SAT}^2 \frac{|x(t)|}{|x(t)|^2 + A_{SAT}} \quad (6)$$

$$\beta[|x(t)|] = \frac{\pi}{3} \frac{|x(t)|^2}{|x(t)|^2 + A_{SAT}^2}$$

$A_{SAT}$ denoting the input saturation voltage.

The clipping 34 can be performed using any standard clipping methods. The clipping applied can be described by the equations below:

$$y = \begin{cases} |x|e^{j\phi}, & |x| \leq A \, \& \, |x| > B \\ Ae^{j\phi} & |x| > A \\ Be^{j\phi} & |x| < B \end{cases} \quad (7)$$

where x is the amplifier distorted time domain signal z(t), y represents the output of the time domain signal after clipping 35, A is the upper threshold clipping level, B is the lower clipping threshold value and $\phi$ is the signal phase.

In alternative implementations of the invention, where distortion caused by near zero values is not as problematic, clipping of near zero values need not be applied and only the test against A is used.

The distorted and clipped time domain signal y (35) is then converted back to the frequency domain through a Fast Fourier Transform (FFT) 36, to generate an OFDM version of the clipped signal. The outputs of this FFT—i.e. the values of the clipped frequency domain signal—are then used in conjunction with the values of the original frequency domain OFDM signal 30 to generate a partially restored frequency domain OFDM signal 42.

It will be seen that within the signal 42, the zero signals in a particular number of the unused sub-carriers of the original frequency domain OFDM signal 30 will have changed to non-zero values in the clipped frequency domain OFDM signal. In the embodiment, the non-zero values for m of the outermost unused sub-carriers are maintained in their non-zero values whereas the values for the remaining unused carriers are reset to zero.

Also, the phase of the pilot carriers in the original frequency domain OFDM signal 30 which changes clipped frequency domain OFDM signal 42 is maintained, with restoration involving restoring the amplitude of the pilot signals to 1.

Also, all of the values of the data sub-carriers from the original frequency domain OFDM signal 30 are restored to their original values before the initial IFFT and clipping steps 32,34.

The partially restored frequency domain OFDM signal 42 is then transformed into the time domain using an IFFT 44, and the resultant time domain OFDM signal 46 analysed for the presence of peaks. If the peaks are below the set threshold A near zero values are greater than B, the resultant time domain OFDM signal 46 is ready to be transmitted. If the peaks are not below the required threshold A, further modification of the signal may be required.

This involves iteratively scaling 48 the altered non-zero values for the m unused carriers introduced because of the original clipping step 34 by a factor $\alpha$ to improve PAPR reduction. As these signals are unused, this scaling has no effect on the content of the data being transmitted. $\alpha$ is chosen to be initially 1 and can be increased iteratively by using an appropriate step size $\mu$ until the resulting signal 46 has a peak less than A and a minimum value of at least B.

As can be seen from FIG. 2, the m unused carriers are scaled prior to the transformation of the partially restored frequency domain OFDM signal 42 into the time domain. The stages of transforming the partially restored frequency domain OFDM signal 42 into the time domain, analysing the peaks of the resultant time domain OFDM signal 46, and the scaling 48, can be repeated until the analysis of the resultant time domain OFDM signal 46 indicates that the peaks present are less than the value of A and greater than B. The signal 46 can then be transmitted, as shown in FIG. 1.

If necessary, clipping can be performed as a last resort if the required threshold is not reached after a certain maximum number of iterations. Alternatively, iteration could stop if the height of the peaks, and consequently the appropriate PAPR for the signal, is no longer decreasing.

Figure 3:
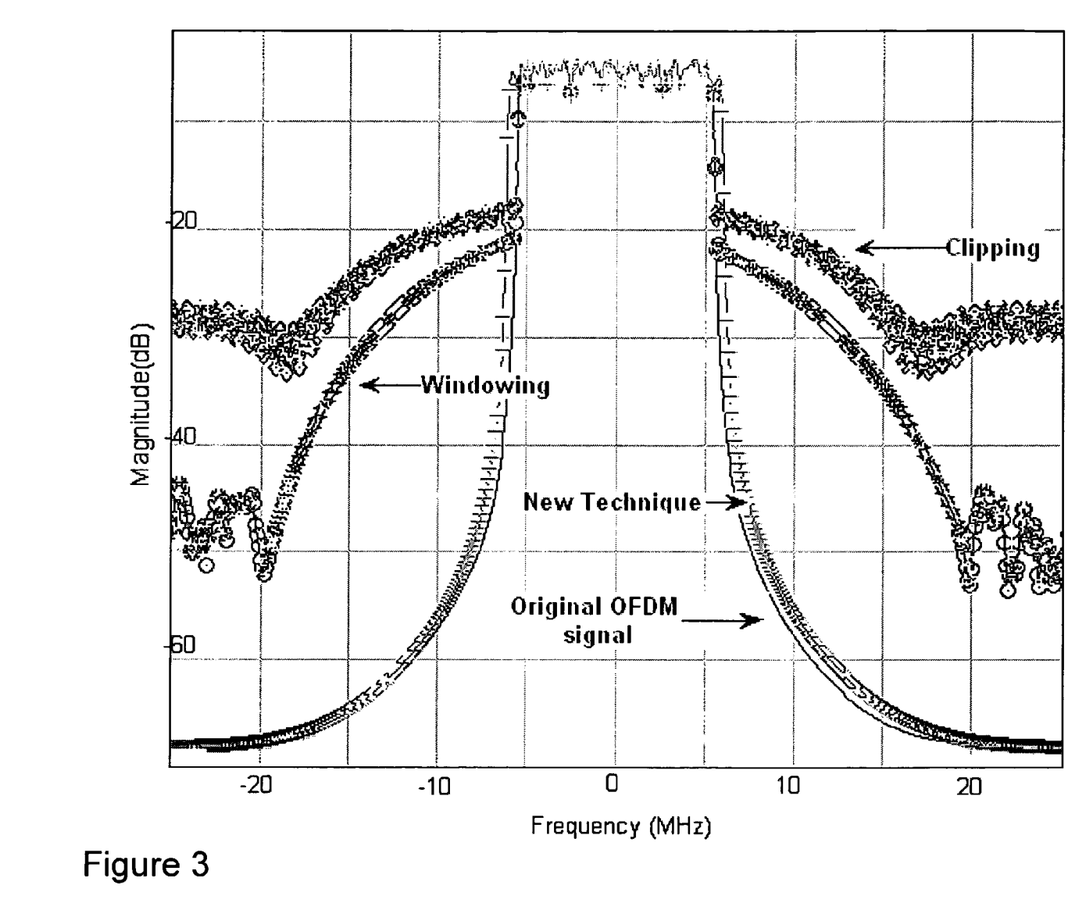
FIG. 3 is a graph showing four different output power spectra: the spectrum of a normal OFDM signal; the spectrum of an OFDM signal after windowing; the spectrum of an OFDM signal after clipping; and the spectrum of an OFDM signal after application of the preferred embodiment of the present invention.
Figure 4:
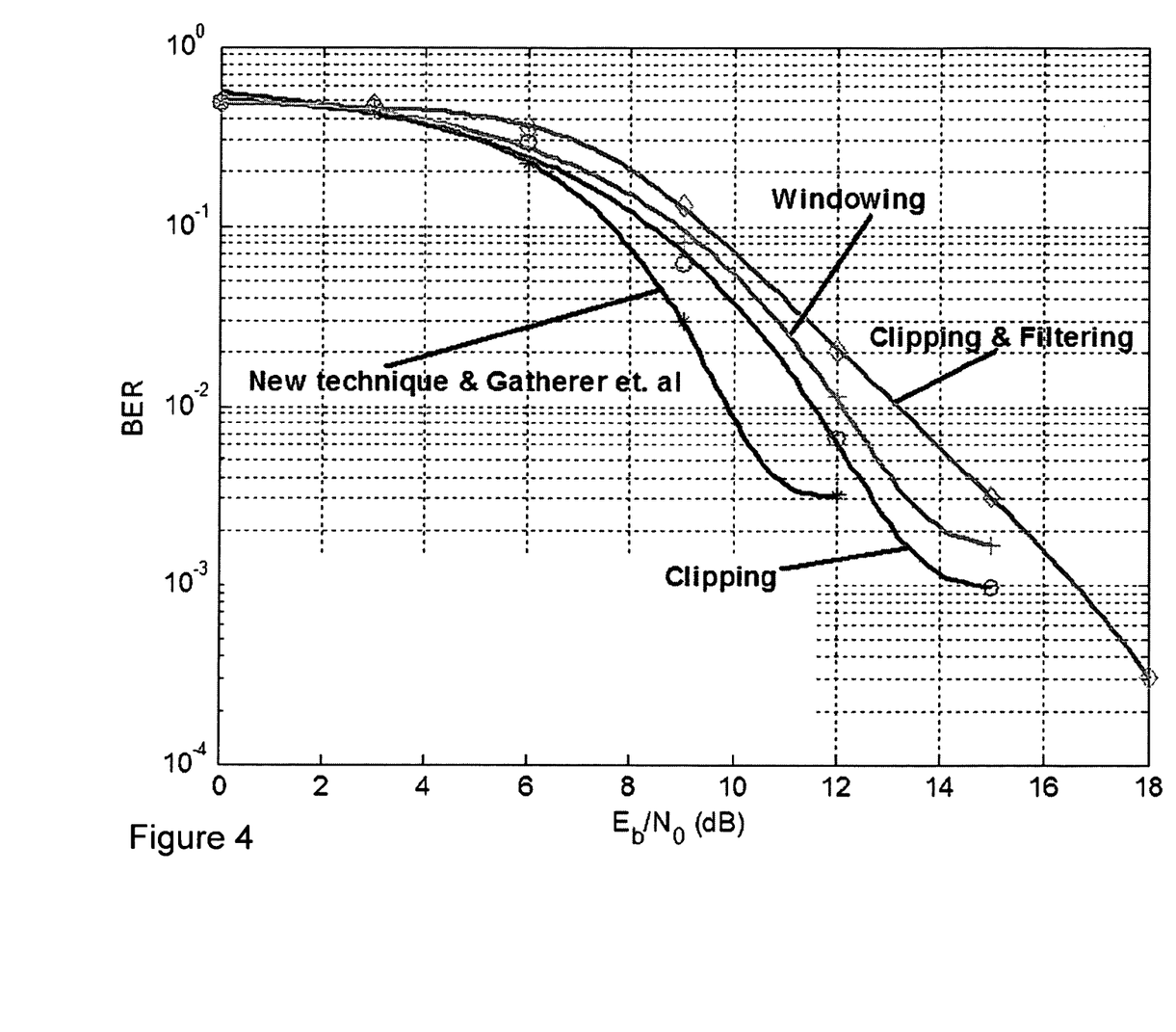
FIG. 4 is a graph of the complementary cumulative distribution function for the original OFDM signal; the OFDM signal after application of the algorithm of the invention, not including the pilot carriers; and the OFDM signal after application of the preferred embodiment of the present invention.
Figure 5:
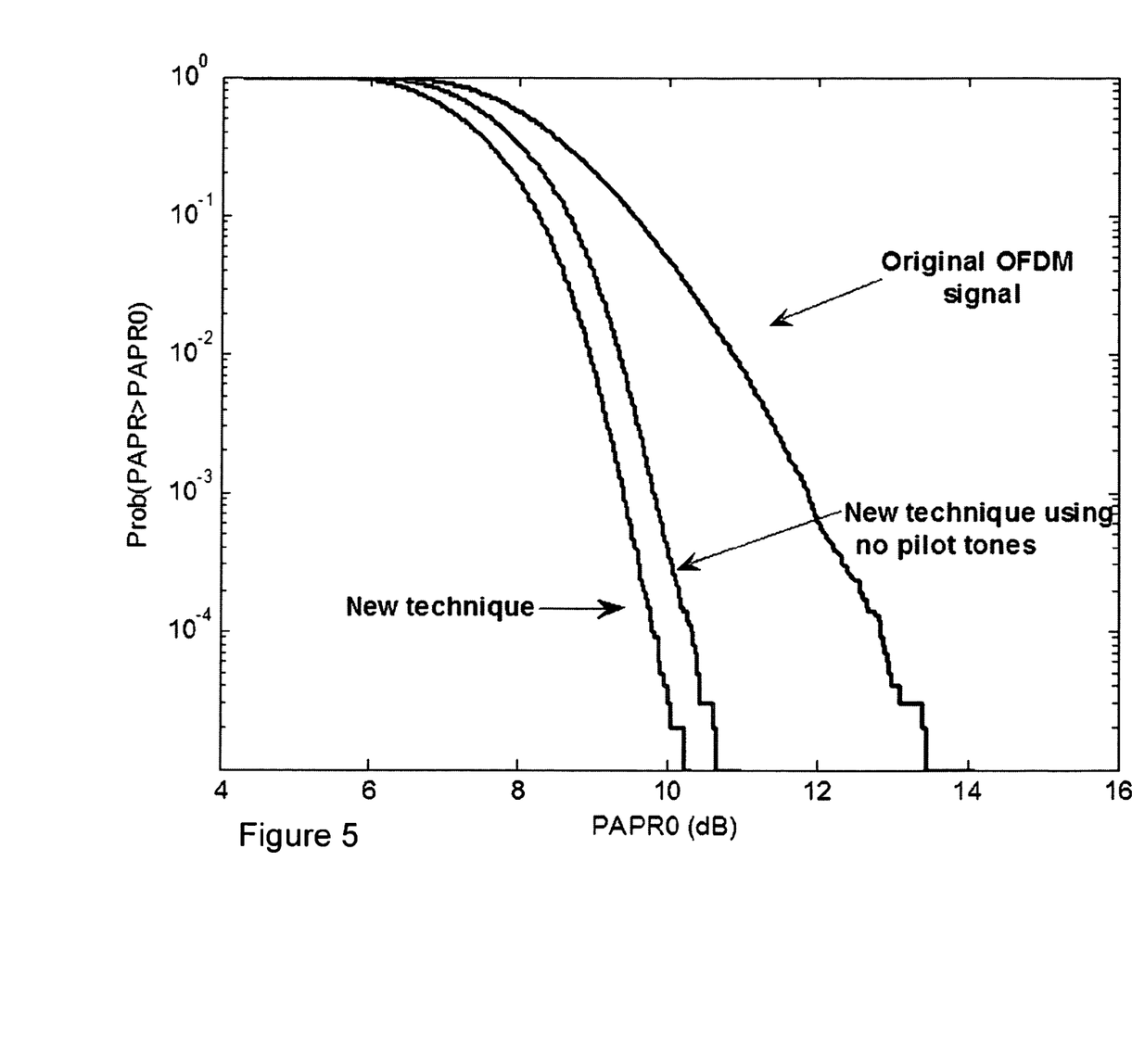
FIG. 5 is a graph of the Bit Error Rate (BER) in an OFDM signal after windowing; an OFDM signal after clipping; and an OFDM signal after application of the preferred embodiment of the present invention.

FIGS. 3-5 illustrate the effectiveness of the technique of the preferred embodiment in relation to other current PAPR reduction techniques for an IEEE802.11A/Hiperlan2 system. It will be understood that the technique may also applicable to other OFDM systems. Similar results as shown in the drawings were obtained for DVB broadcasting, which uses 2048 sub-carriers.

The results obtained showed a decrease in PAPR of 4 dB with a significant reduction in out-of-band distortion (FIG. 3) and a reduced BER compared with clipping and windowing techniques (FIG. 4). For the windowing technique a Gaussian window was employed. Unlike the recursive-clipping technique the BER is not degraded every time iterations are performed as no change is being made to the original data-carriers.

As can be seen in FIG. 5, simulations were carried out for performing PAPR reduction with use of unused carriers alone and unused carriers with the effect of changing the phase of pilot tones. The contribution from the phase of pilot tones was found to be significant and a reduction of approximately 0.95 dB more in PAPR occurred when the use of pilot tones was incorporated with unused tones.

FIG. 6 compares the effectiveness of an embodiment of the present invention with that of Gatherer, A.; Polley, M. Signals, "Controlling clipping probability in DMT transmission" *Conference Record of the Thirty-First Asilomar Conference on Systems & Computers*, Vol. 1, Iss., pp. 578-584, November 1997. Each technique is compared using only 5 of the unused tones and a maximum of 3 iterations. Only PAPR is performed for both techniques and there is no removal of near-zero values.

Figure 7:
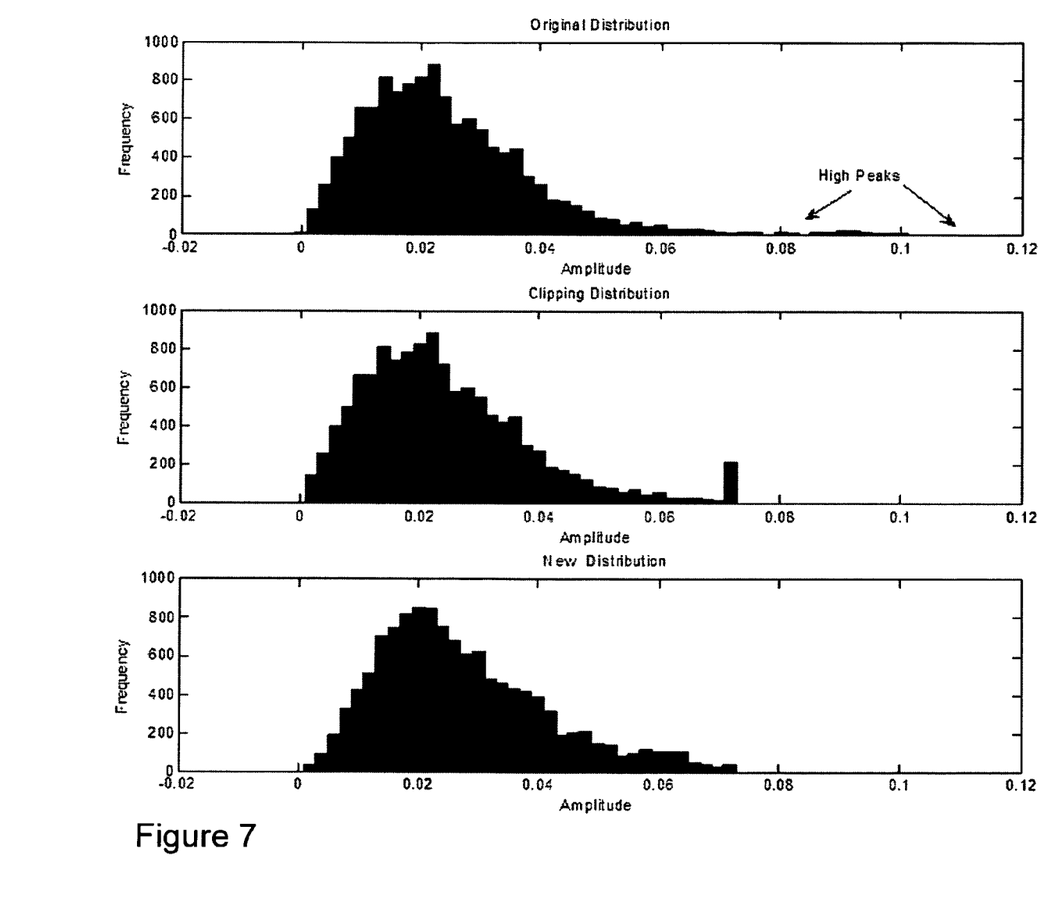
FIG. 7 shows the distribution of the original signal and the transformation of the distribution for the clipping technique and that of the preferred embodiment of the present invention.

FIG. 7 shows the distribution of the original signal and the transformation of the distribution for the clipping technique and that of the preferred embodiment. The present technique for conditioning the signal has a much smoother distribution than clipping for removal of undesired near-zero values and high peaks.

The main advantages of this technique of the preferred embodiment are its very low out-of-band distortion. It also has a lower BER than clipping and windowing due to no interference with the original data carriers before transmission.

In the simulations, the value of m was chosen to be 5 as this was a good compromise between the PAPR reduction achieved and the broadening of the original OFDM symbol.

The invention is not limited to the embodiment(s) described herein but can be amended or modified without departing from the scope of the present invention.

The invention claimed is:

1. A method of processing an Orthogonal Frequency-Division Multiplex (OFDM) signal having a plurality of data carriers and a plurality of unused carriers, the method comprising:
   (a) transforming an original frequency-domain OFDM signal into a time domain signal;
   (b) simulating the effect of a non-linear amplifier on the time-domain signal to provide a potentially distorted time domain signal;
   (c) transforming the potentially distorted time domain signal into a potentially distorted frequency domain signal;
   (d) restoring at least some of any values of the data carriers in the potentially distorted frequency domain signal with corresponding values from said original frequency domain signal;
   (e) scaling at least some of the unused carriers in the at least partially restored frequency domain signal with a scaling factor;
   (f) transforming the scaled frequency domain signal into a temporary time domain signal;
   (g) analysing the temporary time domain signal for the presence of a peak or near zero amplitude value that would lead to distortion by said amplifier; and
   (h) responsive to said signal including such a peak or near zero value, repeating steps (e), (f) and (g) with an increased scaling factor.

2. A method as claimed in claim 1 wherein said scaling factor is initially set to 1.

3. A method as claimed in claim 2 wherein said scaling factor is incremented in steps which are sized to balance speed of convergence versus effective PAPR reduction.

4. A method as claimed in claim 1 further comprising the step of:
   (i) responsive to said signal not including such a peak or near-zero value, modulating, amplifying and transmitting said temporary time domain signal.

5. A method as claimed in claim 1 wherein said simulating is performed according to the equations:

$$y = \begin{cases} |x|e^{j\phi}, & |x| \leq A \ \& \ |x| > B \\ Ae^{j\phi} & |x| > A \\ Be^{j\phi} & |x| < B \end{cases}$$

where x is the time domain signal, y represents the output of the time domain signal after clipping, A is an upper threshold clipping level, B is a lower clipping threshold value and $\phi$ is the signal phase.

6. A method as claimed in claim 1 wherein said simulating is performed according to the equations:

$$y = \begin{cases} |x|e^{j\phi}, & |x| \leq A \\ Ae^{j\phi}, & |x| > A \end{cases}$$

where x is the time domain signal, y represents the output of the time domain signal after clipping, A is an upper threshold clipping level and $\phi$ is the signal phase.

7. A method as claimed in claim 1, wherein the time domain signal is oversampled before said simulating.

8. A method as claimed in claim 7 wherein the time domain signal is oversampled by a factor of four.

9. A method as claimed in claim 1 wherein the original frequency domain signal further comprises a plurality of pilot carriers, and wherein said restoring comprises:
   restoring the amplitude of the pilot carriers to their original amplitude.

10. A method as claimed in claim 1 further comprising the step of:
    responsive to the respective ratios of a highest peak and lowest amplitude in a temporary time domain signal to the average power of the temporary time domain signal not being less or greater than said ratio for a previous temporary time domain signal, modulating, amplifying and transmitting said temporary time domain signal.

11. A method as claimed in claim 1 wherein said steps (e), (f) and (g) are not repeated more than a maximum number of iterations.

* * * * *